United States Patent
Hagino (10) Patent No.: US 9,484,716 B2
(45) Date of Patent: Nov. 1, 2016

(54) SURFACE EMITTING LASER, ATOMIC OSCILLATOR, AND MANUFACTURING METHOD OF SURFACE EMITTING LASER

(71) Applicant: Seiko Epson Corporation, Tokyo (JP)

(72) Inventor: Takashi Hagino, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/925,064

(22) Filed: Oct. 28, 2015

(65) Prior Publication Data
US 2016/0126703 A1     May 5, 2016

(30) Foreign Application Priority Data
Oct. 29, 2014   (JP) ................. 2014-220035

(51) Int. Cl.
| | |
|---|---|
| H01S 5/34 | (2006.01) |
| H01S 5/343 | (2006.01) |
| H03B 17/00 | (2006.01) |
| H01S 5/187 | (2006.01) |
| H01S 5/183 | (2006.01) |

(52) U.S. Cl.
CPC ............. *H01S 5/3432* (2013.01); *H01S 5/187* (2013.01); *H01S 5/18361* (2013.01); *H03B 17/00* (2013.01)

(58) Field of Classification Search
CPC ..................................... H01S 5/3432
USPC ...................... 331/94.1; 372/45.01
See application file for complete search history.

(56) References Cited

U.S. PATENT DOCUMENTS

2015/0044795 A1* 2/2015 Futagawa ............ H01S 5/0217
                                                          438/29

FOREIGN PATENT DOCUMENTS

JP         2009-289907 A      12/2009

* cited by examiner

*Primary Examiner* — Joseph Chang
(74) *Attorney, Agent, or Firm* — Harness, Dickey & Pierce, P.L.C.

(57) ABSTRACT

A surface emitting laser includes: a substrate; and a laminated body disposed over the substrate, wherein the laminated body includes a first mirror layer disposed over the substrate, an active layer disposed over the first mirror layer, and a second mirror layer disposed over the active layer, and surface roughness Ra of an uppermost layer of the first mirror layer is greater than or equal to 0.45 nm and less than or equal to 1.0 nm.

11 Claims, 8 Drawing Sheets

SURFACE EMITTING LASER, ATOMIC OSCILLATOR, AND MANUFACTURING METHOD OF SURFACE EMITTING LASER

BACKGROUND

1. Technical Field

The present invention relates to a surface emitting laser, an atomic oscillator, and a manufacturing method of a surface emitting laser.

2. Related Art

A surface emitting laser (a Vertical Cavity Surface Emitting Laser: VCSEL), for example, is used as a light source of an atomic oscillator using Coherent Population Trapping (CPT) which is one of quantum interference effects.

For example, in JP-A-2009-289907, a surface emitting laser including a first distribution Bragg reflector, a second distribution Bragg reflector, and an active layer disposed between the first distribution Bragg reflector and the second distribution Bragg reflector is disclosed. In the surface emitting laser of JP-A-2009-289907, at least one of the first distribution Bragg reflector and the second distribution Bragg reflector (DBR) includes a first layer formed of AlGaAs, and a second layer formed of AlGaAs of which an Al composition is lower than that of the first layer, and a decrease in emission intensity is suppressed by setting a carbon concentration in the first layer to be less than or equal to $1 \times 10^{18}$ cm$^{-3}$. In the surface emitting laser, it is important to suppress the decrease in the emission intensity, and thus there is a demand for a surface emitting laser having high reliability in which the decrease in the emission intensity is reduced.

Here, in JP-A-2009-289907 described above, it is disclosed that a correlation between the carbon concentration in the AlGaAs layer of the DBR and aging properties is obtained, and thus a surface emitting laser in which the decrease in the emission intensity is suppressed has been found. In contrast, the inventor has focused on a correlation between the surface roughness Ra of n-DBR and aging properties, and thus has achieved the invention.

SUMMARY

An advantage of some aspects of the invention is to provide a surface emitting laser which is able to increase reliability by reducing a decrease in emission intensity, and a manufacturing method thereof. Another advantage of some aspects of the invention is to provide an atomic oscillator including the surface emitting laser described above.

A surface emitting laser according to an aspect of the invention includes a substrate; and a laminated body disposed over the substrate, in which the laminated body includes a first mirror layer disposed over the substrate, an active layer disposed over the first mirror layer, and a second mirror layer disposed over the active layer, and surface roughness Ra of an uppermost layer of the first mirror layer is greater than or equal to 0.45 nm and less than or equal to 1.0 nm.

According to such a surface emitting laser, the surface roughness Ra of the uppermost layer of the first mirror layer is greater than or equal to 0.45 nm and less than or equal to 1.0 nm, and thus as described below, it is possible to reduce a decrease in emission intensity, and it is possible to increase reliability.

In the description according to the invention, when the phrase "over", for example, is used in "forming another specific part (hereinafter, referred to as "B") over a "specific part (hereinafter, referred to as "A")", the phrase "over" is used as a term including a case where B is directly formed on A and a case where B is formed on A through other parts.

In the surface emitting laser according to the aspect of the invention, the first mirror layer may include a first layer formed of AlGaAs, and a second layer formed of AlGaAs of which an Al composition is lower than that of the first layer.

According to such a surface emitting laser, it is possible to reduce the decrease in the emission intensity, and it is possible to increase the reliability.

In the surface emitting laser according to the aspect of the invention, a concentration of carbon doped onto the first layer may be greater than or equal to $7.5 \times 10^{17}$ cm$^{-3}$ and less than or equal to $2.0 \times 10^{18}$ cm$^{-3}$.

According to such a surface emitting laser, the concentration of the carbon doped onto the first layer is greater than or equal to $7.5 \times 10^{17}$ cm$^{-3}$ and less than or equal to $2.0 \times 10^{18}$ cm$^{-3}$, and thus as described below, it is possible to reduce the decrease in the emission intensity, and it is possible to increase the reliability.

An atomic oscillator according to another aspect of the invention includes the surface emitting laser according to the aspect of the invention.

According to such an atomic oscillator, it is possible to include the surface emitting laser which is able to increase the reliability by reducing the decrease in the emission intensity.

A manufacturing method of a surface emitting laser according to still another aspect of the invention includes forming a first mirror layer over a substrate; forming an active layer over the first mirror layer; forming a second mirror layer over the active layer; and forming a laminated body by patterning the first mirror layer, the active layer, and the second mirror layer, in which in the forming of the first mirror layer, surface roughness Ra of an uppermost layer of the first mirror layer is controlled to be greater than or equal to 0.45 nm and less than or equal to 1.0 nm by controlling a concentration of carbon doped onto the first mirror layer.

According to such a manufacturing method of a surface emitting laser, in the forming of the first mirror layer, the surface roughness Ra of the uppermost layer of the first mirror layer is controlled to be greater than or equal to 0.45 nm and less than or equal to 1.0 nm by controlling the concentration of the carbon doped onto the first mirror layer, and thus it is possible to reduce the decrease in the emission intensity, and it is possible to obtain the surface emitting laser having high reliability.

In the manufacturing method of a surface emitting laser according to the aspect of the invention, the first mirror layer may include a first layer formed of AlGaAs, and a second layer formed of AlGaAs of which an Al composition is lower than that of the first layer.

According to such a manufacturing method of a surface emitting laser, it is possible to reduce the decrease in the emission intensity, and it is possible to obtain the surface emitting laser having high reliability.

In the manufacturing method of a surface emitting laser according to the aspect of the invention, in the forming of the first mirror layer, the concentration of the carbon doped onto the first layer may be greater than or equal to $7.5 \times 10^{17}$ cm$^{-3}$ and less than or equal to $2.0 \times 10^{18}$ cm$^{-3}$.

According to such a manufacturing method of a surface emitting laser, it is possible to reduce the decrease in the emission intensity, and it is possible to obtain the surface emitting laser having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail with reference to the drawings. Furthermore, the embodiment described below does not unduly limit the contents of the invention described in the appended Claims. In addition, it is not limited to that all configurations described in this embodiment are essential configuration requirements of the invention.

1. Surface Emitting Laser

Figure 1:
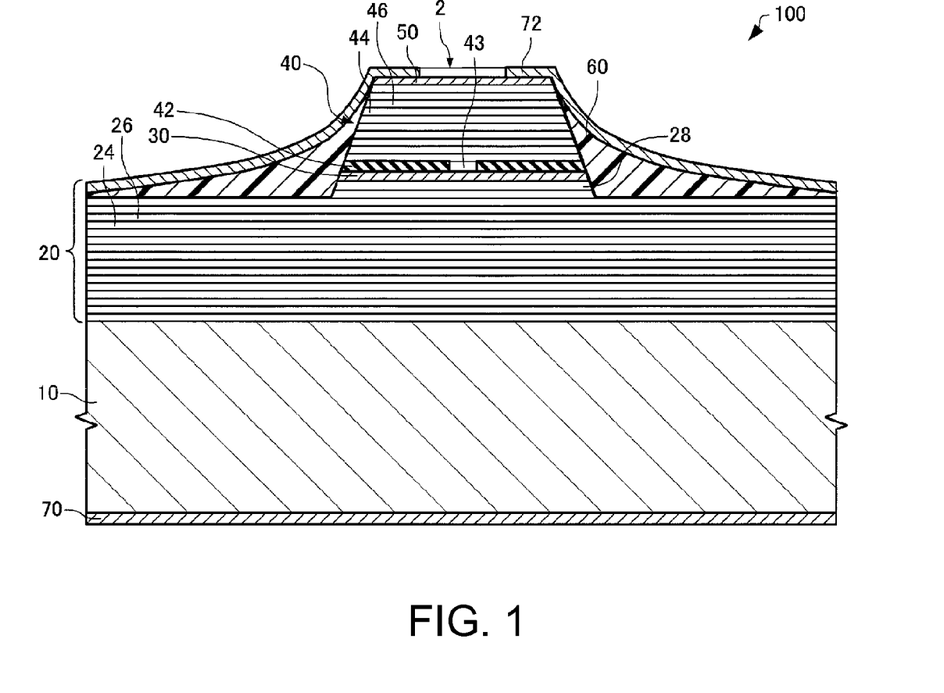
FIG. 1 is a sectional view schematically illustrating a surface emitting laser according to this embodiment.

First, a surface emitting laser according to this embodiment will be described with reference to the drawings. FIG. 1 is a sectional view schematically illustrating a surface emitting laser 100 according to this embodiment.

As illustrated in FIG. 1, the surface emitting laser 100 includes a substrate 10, a first mirror layer 20, an active layer 30, a second mirror layer 40, a current constriction layer 42, a contact layer 50, an insulating layer 60, a first electrode 70, and a second electrode 72.

As the substrate 10, for example, an n type GaAs substrate, and the like are able to be used.

The first mirror layer 20 is formed on the substrate 10. The first mirror layer 20 is an n type semiconductor layer. The first mirror layer 20 is a distribution Bragg reflection type (a DBR mirror) layer in which a high Al composition layer (a first layer) 24 having a low refractive index and a low Al composition layer (a second layer) 26 having a high refractive index are alternately laminated. The high Al composition layer 24 is a layer formed of AlGaAs, and the low Al composition layer 26 is a layer formed of AlGaAs of which the Al composition is lower than that of the high Al composition layer 24. The high Al composition layer 24 and the low Al composition layer 26 are doped with Si. The high Al composition layer 24, for example, is a layer formed of n type $Al_{0.9}Ga_{0.1}As$ which is doped with Si, and the low Al composition layer 26, for example, is a layer formed of n type $Al_{0.12}Ga_{0.88}As$ which is doped with Si. The number of laminations (the number of pairs) of the high Al composition layer 24 and the low Al composition layer 26, for example, is greater than or equal to 10 pairs and less than or equal to 50 pairs, and for example, is 40.5 pairs.

The high Al composition layer 24 is doped with carbon (C). The concentration of the carbon doped onto the high Al composition layer 24 is greater than or equal to $7.5 \times 10^{17}$ $cm^{-3}$ and less than or equal to $2.0 \times 10^{18}$ $cm^{-3}$. More preferably, the concentration of the carbon doped onto the high Al composition layer 24 is greater than or equal to $1.3 \times 10^{18}$ $cm^{-3}$ and less than or equal to $1.8 \times 10^{18}$ $cm^{-3}$.

The surface roughness Ra of an uppermost layer 28 of the first mirror layer 20 is greater than or equal to 0.45 nm and less than or equal to 1.0 nm. The surface roughness Ra of the uppermost layer 28 of the first mirror layer 20 is preferably greater than or equal to 0.45 nm and less than or equal to 0.93 nm, and is more preferably greater than or equal to 0.45 nm and less than or equal to 0.47 nm. Here, the uppermost layer 28 of the first mirror layer 20, for example, is a layer positioned on the most active layer 30 side among a plurality of high AlGaAs layers 24 and a plurality of low AlGaAs layers 26 configuring the first mirror layer 20, and in the illustrated example, the active layer 30 is formed on the surface (an upper surface) of the uppermost layer 28 of the first mirror layer 20.

Furthermore, the roughness (arithmetic mean roughness) Ra indicates a value obtained by the following expression when a reference length of 1 is extracted from a roughness curve in an average line direction, an X axis is set in the average line direction of the extraction portion and a Y axis is set in an axial magnification direction, and the roughness curve is denoted by y=f(x).

$$Ra = \frac{1}{l} \int_0^l |f(x)| dx \qquad \text{Expression 1}$$

There is a correlation between the concentration of the carbon doped onto the high Al composition layer 24 and the surface roughness Ra of the uppermost layer 28 of the first mirror layer 20. This correlation will be described in "3. Experimental Examples" described below.

The active layer 30 is disposed on the first mirror layer 20. The active layer 30, for example, has a multiple quantum well (MQW) structure in which a quantum well structure configured of an i type $In_{0.06}Ga_{0.94}As$ layer and an i type $Al_{0.3}Ga_{0.7}As$ layer are stacked in three layers.

The second mirror layer 40 is formed on the active layer 30. The second mirror layer 40 is a p type semiconductor layer. The second mirror layer 40 is a distribution Bragg reflection type (a DBR mirror) layer in which a high Al composition layer 44 having a low refractive index and a low Al composition layer 46 having a high refractive index are alternately laminated. The high Al composition layer 44 is a layer formed of AlGaAs, and the low Al composition layer 46 is a layer formed of AlGaAs of which the Al composition is lower than that of the high Al composition layer 44. The high Al composition layer 44, for example, is a p type $Al_{0.9}Ga_{0.1}As$ layer doped with carbon. The low Al composition layer 46, for example, is a p type $Al_{0.12}Ga_{0.88}As$ layer doped with carbon. The number of laminations (the number of pairs) of the high Al composition layer 44 and the low Al composition layer 46, for example, is greater than or equal to 3 pairs and less than or equal to 40 pairs, and for example, is 20 pairs.

The second mirror layer 40, the active layer 30, and the first mirror layer 20 configure a vertical resonator type pin diode. When a forward voltage of the pin diode is applied between the electrodes 70 and 72, an electron and a hole are coupled again in the active layer 30, and thus emission occurs. Light generated in the active layer 30 reciprocates (is multiple-reflected) between the first mirror layer 20 and the second mirror layer 40, and at this time, induced emission occurs, and thus the intensity is amplified. Then, when an optical gain is greater than an optical loss, laser oscillation occurs, and thus laser light is emitted from the upper surface of the contact layer 50 in a perpendicular direction (a lamination direction of the first mirror layer 20 and the active layer 30).

The current constriction layer 42 is disposed between the first mirror layer 20 and the second mirror layer 40. In the illustrated example, the current constriction layer 42 is disposed on the active layer 30. The current constriction layer 42 is able to be disposed in the first mirror layer 20 or the second mirror layer 40. The current constriction layer 42 is an insulating layer having an opening portion 43 thereon. The current constriction layer 42 is able to prevent a current injected to the vertical resonator by the electrodes 70 and 72 from being spread in a planar direction (a direction orthogonal to the lamination direction of the first mirror layer 20 and the active layer 30).

The contact layer 50 is disposed on the second mirror layer 40. The contact layer 50 is a p type semiconductor layer. The contact layer 50, for example, is a p type GaAs layer doped with carbon.

A part of the first mirror layer 20, the active layer 30, the second mirror layer 40, the current constriction layer 42, and the contact layer 50 configure a columnar laminated body 2. In the example illustrated in FIG. 1, the laminated body 2 is surrounded by the insulating layer 60. The planar shape of the laminated body 2, for example, is a circular shape.

The insulating layer 60 is disposed on the first mirror layer 20. The insulating layer 60 is disposed in at least the side surface of the laminated body 2. The insulating layer 60 is formed to surround the laminated body 2. The insulating layer 60 is able to electrically separate the second electrode 72 from the first mirror layer 20. The material of the insulating layer 60 is not particularly limited insofar as the material is an insulating material, and as the material, for example, a resin such as polyimide is included.

The first electrode 70 is formed on a lower surface of the substrate 10 (a surface of the substrate 10 on a side opposite to a surface on which the first mirror layer 20 is formed). The first electrode 70 is in Ohmic contact with the substrate 10. The first electrode 70 is electrically connected to the first mirror layer 20 through the substrate 10. Furthermore, the first electrode 70 may be formed on the first mirror layer 20. The first electrode 70 is one electrode for injecting the current to the active layer 30.

The second electrode 72 is disposed on the contact layer 50 (on the laminated body 2). The second electrode 72 is in Ohmic contact with the contact layer 50. In the illustrated example, the second electrode 72 is further formed on the insulating layer 60. The second electrode 72 is electrically connected to the second mirror layer 40 through the contact layer 50. The second electrode 72 is the other electrode for injecting the current to the active layer 30. The second electrode 72 includes an opening portion on the laminated body 2. A region in which the second electrode 72 is not disposed is formed in the upper surface of the contact layer 50 by the opening portion. This region is an emission surface of the laser light. The planar shape of the emission surface, for example, is a circular shape.

The surface emitting laser 100, for example, is used as a light source of an atomic oscillator using Coherent Population Trapping (CPT), an illumination device, and the like.

The surface emitting laser 100, for example, has the following characteristics.

In the surface emitting laser 100, the surface roughness Ra of the uppermost layer 28 of the first mirror layer 20 is greater than or equal to 0.45 nm and less than or equal to 1.0 nm. Accordingly, it is possible to make the active layer 30 formed on the first mirror layer 20 an excellent layer having few crystal defects, and it is possible to reduce a decrease in emission intensity by suppressing the occurrence of a dislocation network due to distortion from the current at driving, heat, the insulating layer 60, and the like (refer to "3. Experimental Examples" described below). Therefore, in the surface emitting laser 100, it is possible to reduce the decrease in the emission intensity, and it is possible to increase reliability.

In the surface emitting laser 100, the concentration of the carbon doped onto the high Al composition layer 24 is greater than or equal to $7.5 \times 10^{18}$ cm$^{-3}$ and less than or equal to $2.0 \times 10^{18}$ cm$^{-3}$. Accordingly, it is possible to obtain a sufficient n type carrier concentration, and it is possible to reduce the decrease in the emission intensity (refer to "3. Experimental Examples" described below). In an n type AlGaAs semiconductor, a silicon element which functions as a donor is doped, but carbon functions as an acceptor, and thus compensates the n type carrier concentration. When the carbon concentration increases, a sufficient n type carrier concentration is obtained, and thus it is necessary that the silicon is doped with a higher concentration, but when the silicon is doped with a high concentration, a DX center is formed, and thus optical output decreases. In contrast, in the surface emitting laser 100, by setting the concentration of the carbon doped onto the high Al composition layer 24 to be greater than or equal to $7.5 \times 10^{17}$ cm$^{-3}$ and less than or equal to $2.0 \times 10^{18}$ cm$^{-3}$, it is possible to obtain a sufficient n type carrier concentration without having such a problem, and it is possible to reduce the decrease in the emission intensity. Therefore, in the surface emitting laser 100, it is possible to reduce the decrease in the emission intensity, and it is possible to increase the reliability.

2. Manufacturing Method of Surface Emitting Laser

Figure 2:
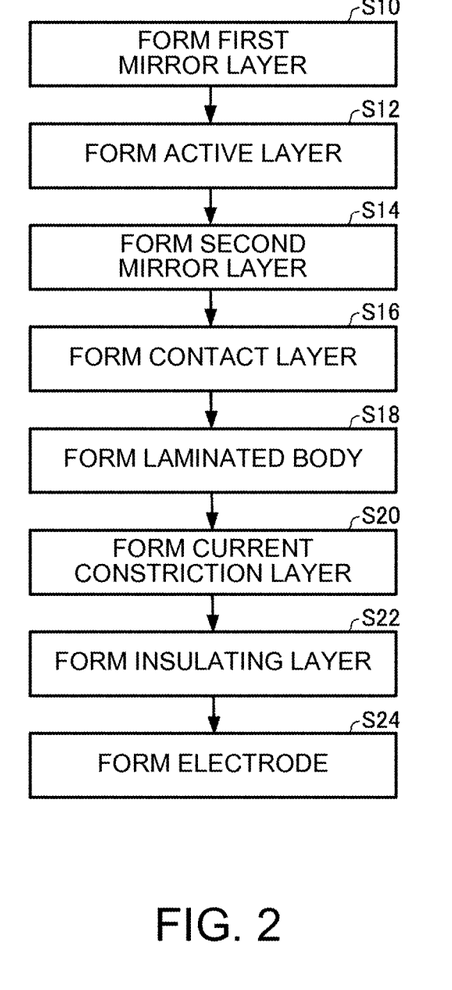
FIG. 2 is a flowchart illustrating an example of a manufacturing method of a surface emitting laser according to this embodiment.
Figure 3:
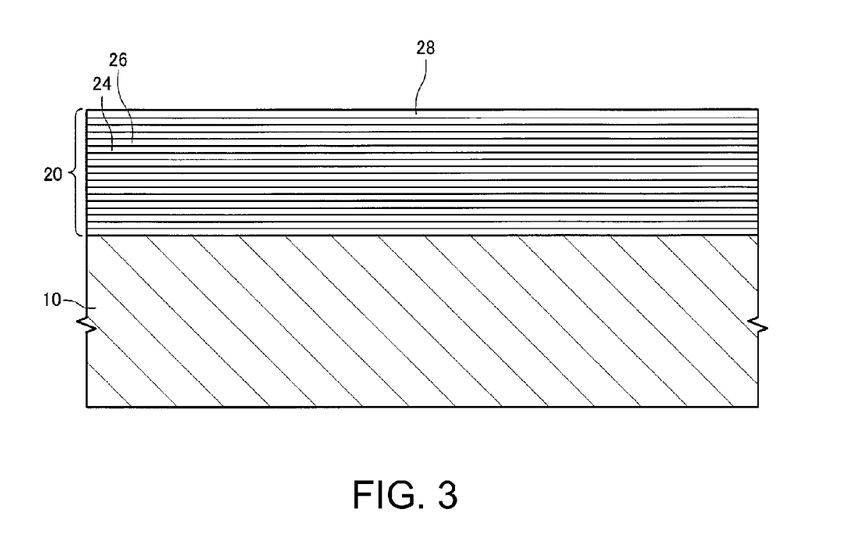
FIG. 3 is a sectional view schematically illustrating a manufacturing process of the surface emitting laser according to this embodiment.
Figure 4:
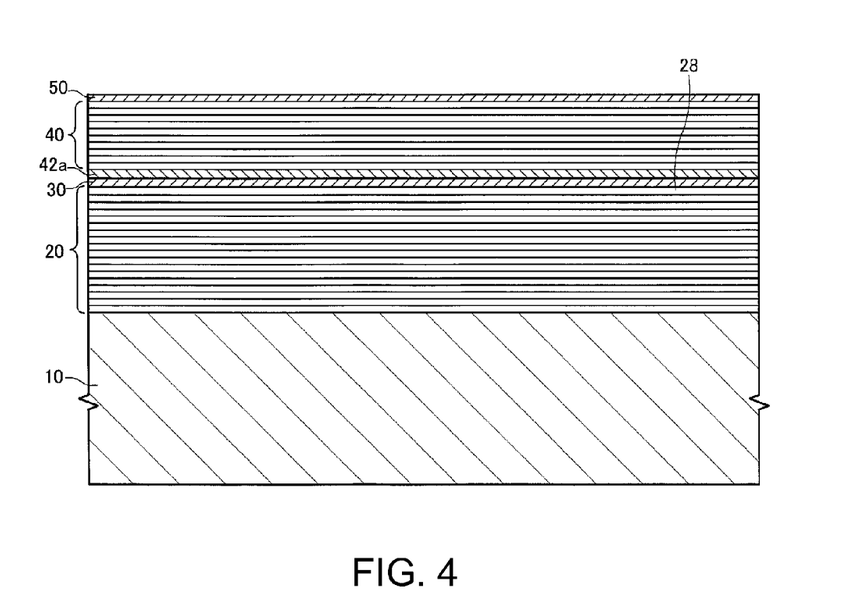
FIG. 4 is a sectional view schematically illustrating the manufacturing process of the surface emitting laser according to this embodiment.
Figure 5:
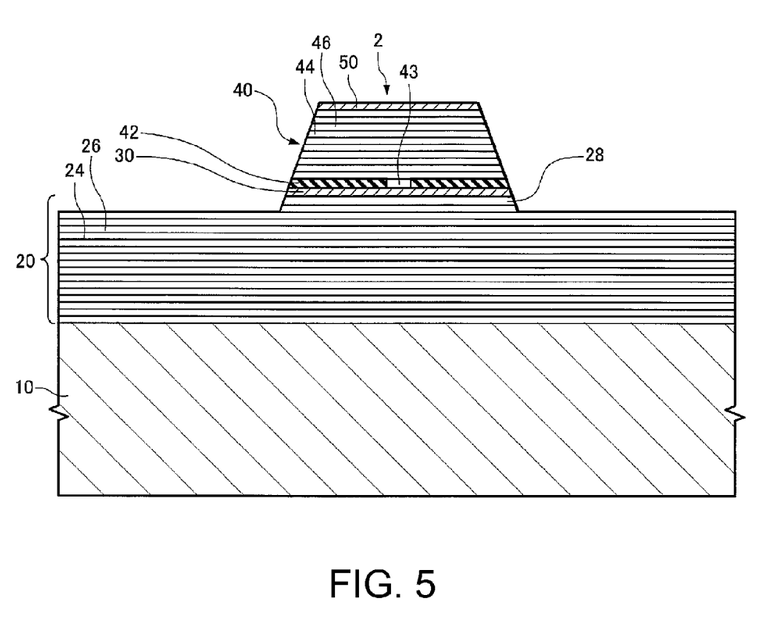
FIG. 5 is a sectional view schematically illustrating the manufacturing process of the surface emitting laser according to this embodiment.

Next, a manufacturing method of a surface emitting laser according to this embodiment will be described with reference to the drawings. FIG. 2 is a flowchart illustrating an example of the manufacturing method of a surface emitting laser according to this embodiment. FIG. 3 to FIG. 5 are sectional views schematically illustrating a manufacturing process of the surface emitting laser 100 according to this embodiment.

As illustrated in FIG. 3, the first mirror layer 20 is formed on the substrate 10 (Step S10). The first mirror layer 20 is formed by alternately laminating the high Al composition layer 24 and the low Al composition layer 26 on the substrate 10 by performing epitaxial growth thereto. As an epitaxial growth method, for example, a Metal Organic Chemical Vapor Deposition (MOCVD) method, and a Molecular Beam Epitaxy (MBE) method are included.

Here, in a step of forming the first mirror layer 20, the surface roughness Ra of the uppermost layer 28 of the first mirror layer 20 is controlled to be greater than or equal to 0.45 nm and less than or equal to 1.0 nm by controlling the concentration of the carbon doped onto the high Al composition layer 24 of the first mirror layer 20. For example, by setting the concentration of the carbon doped onto the high Al composition layer 24 to be greater than or equal to $7.5 \times 10^{17}$ cm$^{-3}$ and less than or equal to $2.0 \times 10^{18}$ cm$^{-3}$, the surface roughness Ra of the uppermost layer 28 of the first mirror layer 20 is controlled to be greater than or equal to 0.45 nm and less than or equal to 1.0 nm.

More preferably, in the step of forming the first mirror layer 20, by setting the concentration of the carbon doped onto the high Al composition layer 24 to be greater than or equal to $1.3 \times 10^{18}$ cm$^{-3}$ and less than or equal to $1.8 \times 10^{18}$ cm$^{-3}$, the surface roughness Ra of the uppermost layer 28 of the first mirror layer 20 is controlled to be greater than or equal to 0.47 nm and less than or equal to 0.45 nm.

In the AlGaAs semiconductor, there is a correlation between a molar ratio of a group V element (As) and a group III element (Ga and Al) (that is, a V/III ratio) at the time of crystal growth and the concentration of the doped carbon. In addition, as described below, there is a correlation between the concentration of the carbon doped onto the high Al composition layer 24 and the surface roughness Ra of the uppermost layer 28 of the first mirror layer 20. Therefore, in this step, by controlling the V/III ratio at the time of the crystal growth of the high Al composition layer 24, the concentration of the carbon doped onto the high Al composition layer 24 is controlled, and thus the surface roughness Ra of the uppermost layer of the first mirror layer 20 has a desired value.

Furthermore, here, a case is described in which the concentration of the doped carbon is controlled by controlling the V/III ratio at the time of the crystal growth of the high Al composition layer 24, and the concentration of the doped carbon may be controlled by controlling the temperature at the time of the crystal growth of the high Al composition layer 24. In addition, for example, the concentration of the doped carbon may be controlled by controlling the crystal growth rate of the high Al composition layer 24.

As illustrated in FIG. 4, the active layer 30, a layer to be oxidized 42a which is oxidized to be the current constriction layer 42, the second mirror layer 40, and the contact layer 50 are formed on the first mirror layer 20 in this order (Step S12, Step S14, and Step S16). The active layer 30, the layer to be oxidized 42a, the second mirror layer 40, and the contact layer 50, for example, are formed by the epitaxial growth using a MOCVD method, a MBE method, and the like, as with the first mirror layer 20.

As illustrated in FIG. 5, the contact layer 50, the second mirror layer 40, the layer to be oxidized 42a, the active layer 30, and the first mirror layer 20 are patterned, and thus the laminated body 2 is formed (Step S18). The patterning, for example, is performed by lithography and etching.

Next, the layer to be oxidized 42a is oxidized, and thus the current constriction layer 42 is formed (Step S20). The layer to be oxidized 42a, for example, is a Al$_x$Ga$_{1-x}$As (x≥0.95) layer. For example, the substrate 10 on which the laminated body 2 is formed is put into water-vapor atmosphere at approximately 400° C., and thus the Al$_x$Ga$_{1-x}$As (x≥0.95) layer is oxidized from the side surface, and the current constriction layer 42 is formed.

As illustrated in FIG. 1, the insulating layer 60 is formed to surround the laminated body 2 (Step S22). The insulating layer 60, for example, is formed by forming a layer which is formed of a polyimide resin or the like on the upper surface of the first mirror layer 20 and the entire surface of the laminated body 2 using a spin coating method or the like, and by patterning the layer. The patterning, for example, is performed by lithography and etching. Next, the insulating layer 60 is cured by a heat treatment (curing).

Next, the first electrode 70 is formed on the lower surface of the substrate 10, and the second electrode 72 is formed on the contact layer 50 and the insulating layer 60 (Step S24). The electrodes 70 and 72, for example, are formed by using a vacuum vapor deposition method or the like.

According to the steps described above, the surface emitting laser 100 is able to be manufactured.

The manufacturing method of a surface emitting laser according to this embodiment, for example, has the following characteristics.

In the manufacturing method of a surface emitting laser according to this embodiment, in the step of forming the first mirror layer 20 (Step S10), the surface roughness Ra of the uppermost layer 28 of the first mirror layer 20 is controlled to be greater than or equal to 0.45 nm and less than or equal to 1.0 nm by controlling the concentration of the carbon doped onto the first mirror layer 20. Accordingly, it is possible to reduce the decrease in the emission intensity, and it is possible to obtain the surface emitting laser having high reliability (refer to "3. Experimental Examples" described below).

In the manufacturing method of a surface emitting laser according to this embodiment, in the step of forming the first mirror layer 20 (Step S10), the concentration of the carbon doped onto the high Al composition layer 24 is greater than or equal to $7.5 \times 10^{17}$ cm$^{-3}$ and less than or equal to $2.0 \times 10^{18}$ cm$^{-3}$. Accordingly, the surface roughness Ra of the uppermost layer 28 of the first mirror layer 20 is able to be controlled to be greater than or equal to 0.45 nm and less than or equal to 1.0 nm. Therefore, it is possible to reduce the decrease in the emission intensity, and it is possible to obtain the surface emitting laser having high reliability (refer to "3. Experimental Examples" described below).

Furthermore, there is a correlation between the surface roughness Ra of the uppermost layer 28 of the first mirror layer 20 and the concentration of the carbon doped onto the high Al composition layer 24, and thus in the step of forming the first mirror layer 20 (Step S10), the V/III ratio at the time of the crystal growth may be determined by using the surface roughness Ra of the uppermost layer 28 of the first mirror layer 20 as an index. Accordingly, for example, it is possible to prevent laser properties from being degraded due to a variation in the V/III ratio at the time of forming the first mirror layer 20 and a shift of the concentration of the carbon doped onto the high Al composition layer 24 from a desired concentration. Therefore, it is possible to provide the surface emitting laser having a stable quality.

3. Experimental Examples

Hereinafter, the invention will be described in detail with reference to experimental examples, but the invention is not limited to the following experimental examples.

A configuration of a surface emitting laser used in this experimental example is identical to that of the surface emitting laser illustrated in FIG. 1 described above. In this experimental example, as the high Al composition layer configuring the first mirror layer, a layer formed of n type $Al_{0.9}Ga_{0.1}As$ which is doped with Si (an $Al_{0.9}Ga_{0.1}As$ layer) was used. In addition, as the low Al composition layer configuring the first mirror layer, a layer formed of n type $Al_{0.12}Ga_{0.88}As$ which is doped with Si (an $Al_{0.12}Ga_{0.88}As$ layer) was used. The number of laminations (the number of pairs) of the $Al_{0.9}Ga_{0.1}As$ layer and the $Al_{0.12}Ga_{0.88}As$ layer is 40.5 pairs.

In this experimental example, the concentration of carbon doped onto the $Al_{0.9}Ga_{0.1}As$ layer configuring the first mirror layer was set to be a value shown in Table 1 described below, and thus Types A to I of the surface emitting laser were prepared.

Specifically, when the first mirror layer was formed by alternately laminating the $Al_{0.9}Ga_{0.1}As$ layer and the $Al_{0.12}Ga_{0.88}As$ layer on the substrate, a molar ratio of a group V element (As) and a group III element (Ga and Al) at the time of growing the $Al_{0.9}Ga_{0.1}As$ layer was controlled, and the carbon concentration of the $Al_{0.9}Ga_{0.1}As$ layer was set to be the value shown in Table 1 described below, and thus Types A to I of the surface emitting laser were prepared. The carbon concentration of the $Al_{0.9}Ga_{0.1}As$ layer shown in Table 1 was measured by using a secondary ion mass spectrometer (SIMS). Furthermore, in Types A to I, other conditions except for the carbon concentration of the $Al_{0.9}Ga_{0.1}As$ layer were the same.

In Types A to I of the surface emitting laser prepared in this way, the surface roughness Ra of the uppermost surface of the first mirror layer, the carrier concentration of the first mirror layer, and the laser aging properties were evaluated. The results thereof are shown in Table 1.

Furthermore, the surface roughness Ra of the uppermost surface of the first mirror layer was measured by using an atomic force microscope (AFM). In addition, the carrier concentration of the first mirror layer was evaluated by whether or not the surface emitting laser was operated (oscillated) at a predetermined driving voltage.

In addition, the laser aging properties were evaluated by operating each surface emitting laser in predetermined temperature conditions and predetermined driving conditions, and by monitoring a change rate of the optical output with respect to an aging time. The evaluation was performed by using the same type of the surface emitting laser a plurality of times.

Figure 6:
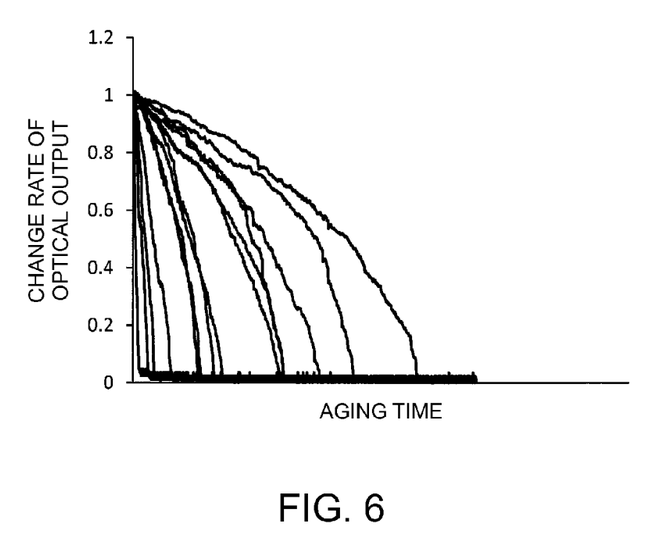
FIG. 6 is a graph illustrating laser aging properties of a surface emitting laser (A) of this experimental example.
Figure 7:
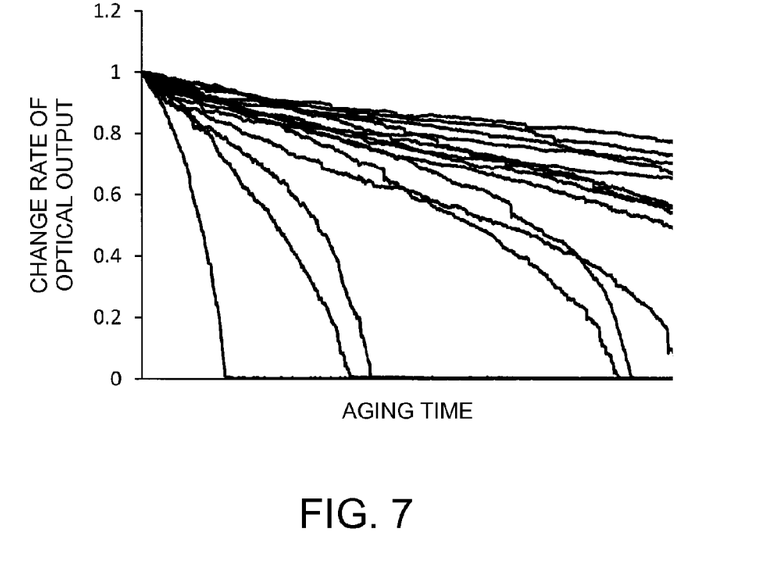
FIG. 7 is a graph illustrating laser aging properties of a surface emitting laser (B) of this experimental example.
Figure 8:
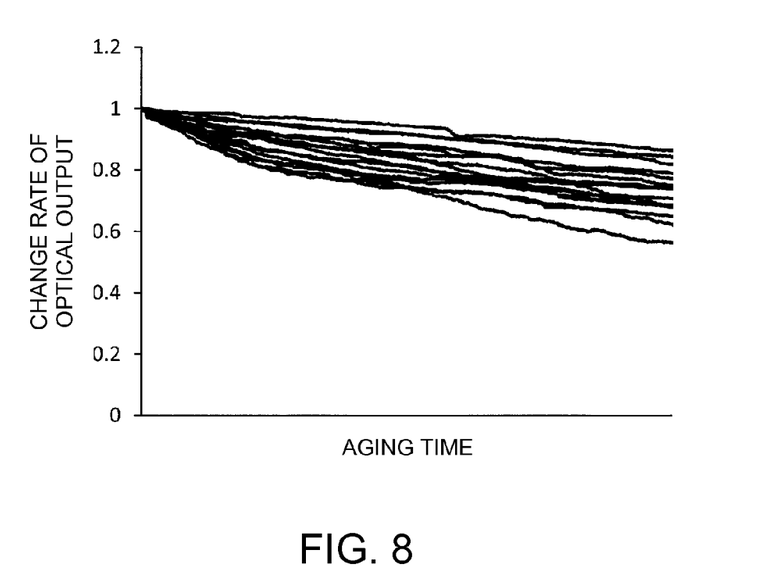
FIG. 8 is a graph illustrating laser aging properties of a surface emitting laser (C) of this experimental example.
Figure 9:
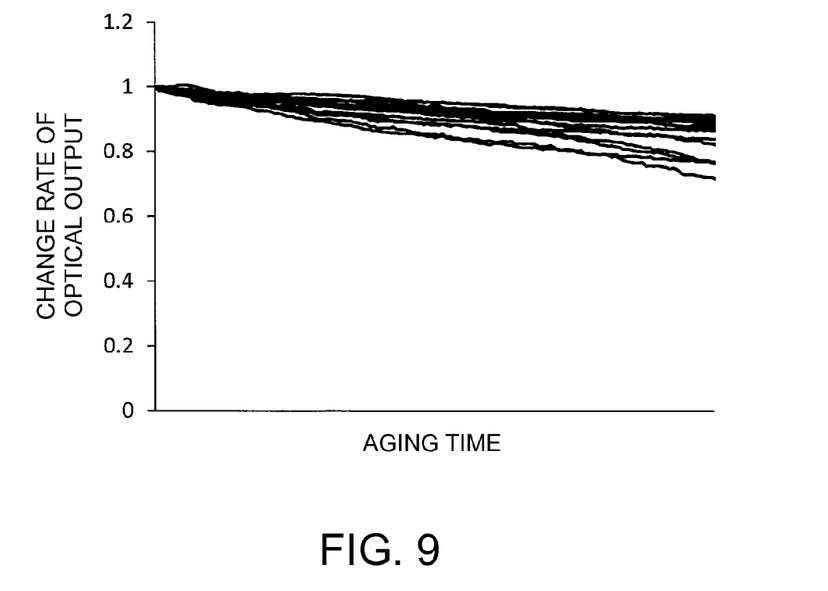
FIG. 9 is a graph illustrating laser aging properties of a surface emitting laser (D) of this experimental example.
Figure 10:
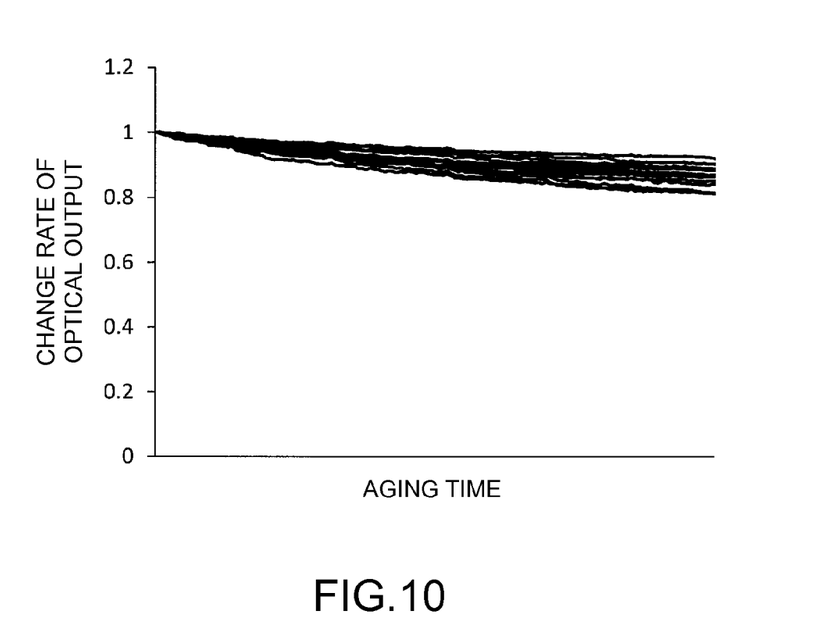
FIG. 10 is a graph illustrating laser aging properties of a surface emitting laser (F) of this experimental example.

FIG. 6 is a graph illustrating the laser aging properties of Type A. FIG. 7 is a graph illustrating the laser aging properties of Type B. FIG. 8 is a graph illustrating the laser aging properties of Type C. FIG. 9 is a graph illustrating the laser aging properties of Type D. FIG. 10 is a graph illustrating the laser aging properties of Type F. In FIG. 6 to FIG. 10, a horizontal axis indicates the aging time, and a vertical axis indicates the change rate of the optical output at the time of setting the initial optical output to 1. Furthermore, the horizontal axis of FIG. 6 to FIG. 10 has the same scale.

In Type A illustrated in FIG. 6, the optical output of all of the evaluated surface emitting laser became 0 within a predetermined time period. In addition, in Type B illustrated in FIG. 7, the optical output of a part of the evaluated surface emitting laser became 0 within a predetermined time period. When the laser aging properties as illustrated in FIG. 6 and FIG. 7 were obtained, the evaluation was "D".

In Type C illustrated FIG. 8, the optical output of all of the evaluated surface emitting laser did not become 0 within a predetermined time period, but the change rate of the optical output of apart of the surface emitting laser was less than 0.8 within a predetermined time period. In addition, a variation in the change rate of the optical output of each of the elements was increased. When the laser aging properties as illustrated in FIG. 8 were obtained, the evaluation was "C".

In Type D illustrated in FIG. 9, the change rate of the optical output of most of the evaluated surface emitting laser was not less than 0.8 within a predetermined time period. When the laser aging properties as illustrated in FIG. 9 were obtained, the evaluation was "B".

In Type F illustrated in FIG. 10, the change rate of the optical output of all of the evaluated surface emitting laser was not less than 0.8 within a predetermined time period. In addition, the variation in the change rate of the optical output of each of the elements was decreased. When the laser aging properties as illustrated in FIG. 10 were obtained, the evaluation was "A".

TABLE 1

| Type | Carbon Concentration ($cm^{-3}$) | Surface Roughness Ra (nm) | Carrier Concentration | Laser Aging Properties |
|---|---|---|---|---|
| A | $3.2 \times 10^{17}$ | 1.45 | B | D |
| B | $5.3 \times 10^{17}$ | 1.30 | B | D |
| C | $7.5 \times 10^{17}$ | 0.93 | B | C |
| D | $9.3 \times 10^{17}$ | 0.89 | B | B |
| E | $9.9 \times 10^{17}$ | 0.69 | B | B |
| F | $1.3 \times 10^{18}$ | 0.47 | B | A |
| G | $1.8 \times 10^{18}$ | 0.45 | B | A |
| H | $2.0 \times 10^{18}$ | 0.45 | B | A |
| I | $5.7 \times 10^{18}$ | 0.40 | D | — |

As shown in Table 1, the surface roughness Ra of the uppermost surface of the first mirror layer was degraded as the carbon concentration of the $Al_{0.9}Ga_{0.1}As$ layer became lower. In particular, when the carbon concentration of the $Al_{0.9}Ga_{0.1}As$ layer was less than or equal to $5.3 \times 10^{17}$ $cm^{-3}$, the surface roughness Ra was greater than or equal to 1.30 nm, and thus the laser aging properties were extremely degraded.

In addition, when the carbon concentration of the $Al_{0.9}Ga_{0.1}As$ layer was greater than or equal to $7.5 \times 10^{17}$ $cm^{-3}$ and less than or equal to $2.0 \times 10^{18}$ $cm^{-3}$, the surface roughness Ra was greater than or equal to 0.45 nm and less than or equal to 0.93 nm, excellent laser aging properties were obtained. In particular, when the carbon concentration of the $Al_{0.9}Ga_{0.1}As$ layer was greater than or equal to $1.3 \times 10^{18}$ $cm^{-3}$ and less than or equal to $1.8 \times 10^{18}$ $cm^{-3}$, the surface roughness Ra was greater than or equal to 0.45 nm and less than or equal to 0.47 nm, and thus the variation in each of the elements was decreased, and the change rate of the optical output was decreased, and thus extremely excellent aging properties were obtained.

In addition, when the carbon concentration of the $Al_{0.9}Ga_{0.1}As$ layer was greater than or equal to $5.7 \times 10^{18}$ $cm^{-3}$, the surface roughness Ra was decreased, but a sufficient carrier concentration was not obtained, and thus the threshold value of the laser oscillation was increased.

From this result, it was found that the surface roughness Ra of the uppermost layer of the first mirror layer was able to be greater than or equal to 0.45 nm and less than or equal to 0.93 nm by setting the carbon concentration of the $Al_{0.9}Ga_{0.1}As$ layer to be greater than or equal to $7.5 \times 10^{17}$ $cm^{-3}$ and less than or equal to $2.0 \times 10^{18}$ $cm^{-3}$, and thus the surface emitting laser having a low decrease in the light intensity and high reliability was able to be obtained.

Further, it was found that the surface roughness Ra of the uppermost layer of the first mirror layer was able to be greater than or equal to 0.45 nm and less than or equal to 0.47 nm by setting the carbon concentration of the $Al_{0.9}Ga_{0.1}As$ layer to be greater than or equal to $1.3 \times 10^{18}$ $cm^{-3}$ and less than or equal to $1.8 \times 10^{18}$ $cm^{-3}$, and thus the surface emitting laser having a lower decrease in the light intensity and higher reliability was able to be obtained.

Figure 11:
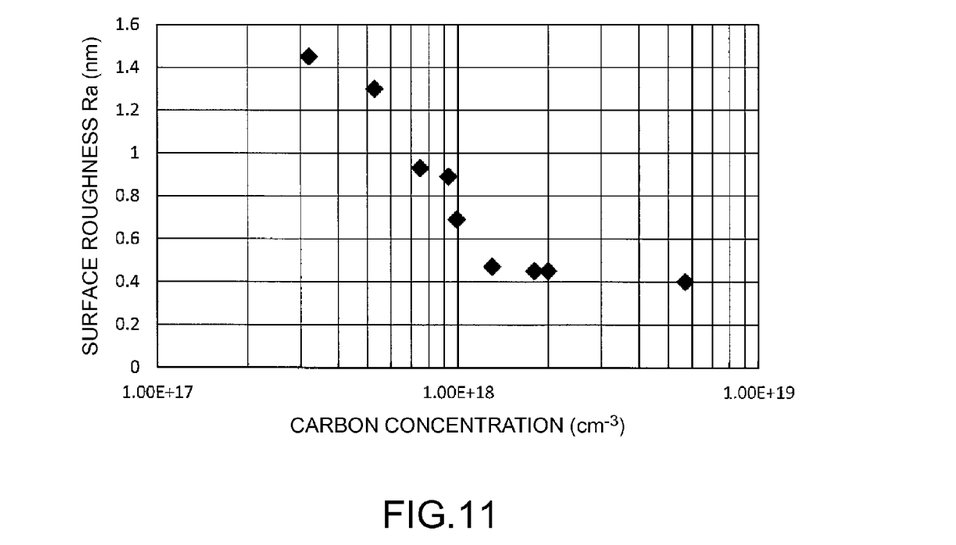
FIG. 11 is a graph illustrating a correlation between a carbon concentration of an $Al_{0.9}Ga_{0.1}As$ layer and surface roughness Ra of an uppermost surface of a first mirror layer in this experimental example.

FIG. 11 is a graph illustrating a correlation between the carbon concentration of the $Al_{0.9}Ga_{0.1}As$ layer and the surface roughness Ra of the uppermost surface of the first mirror layer in this experimental example.

From the graph illustrated in FIG. 11, it is found that there is a correlation between the surface roughness Ra of the uppermost layer of the first mirror layer and the concentration of the carbon doped onto the $Al_{0.9}Ga_{0.1}As$ layer. For this reason, in the step of forming the first mirror layer, the carbon concentration of the $Al_{0.9}Ga_{0.1}As$ layer is obtained by using the surface roughness Ra of the uppermost layer of the first mirror layer as an index, and thus the V/III ratio at the time of the crystal growth is able to be determined. Accordingly, it is possible to provide the surface emitting laser having a stable quality.

4. Atomic Oscillator

Figure 12:
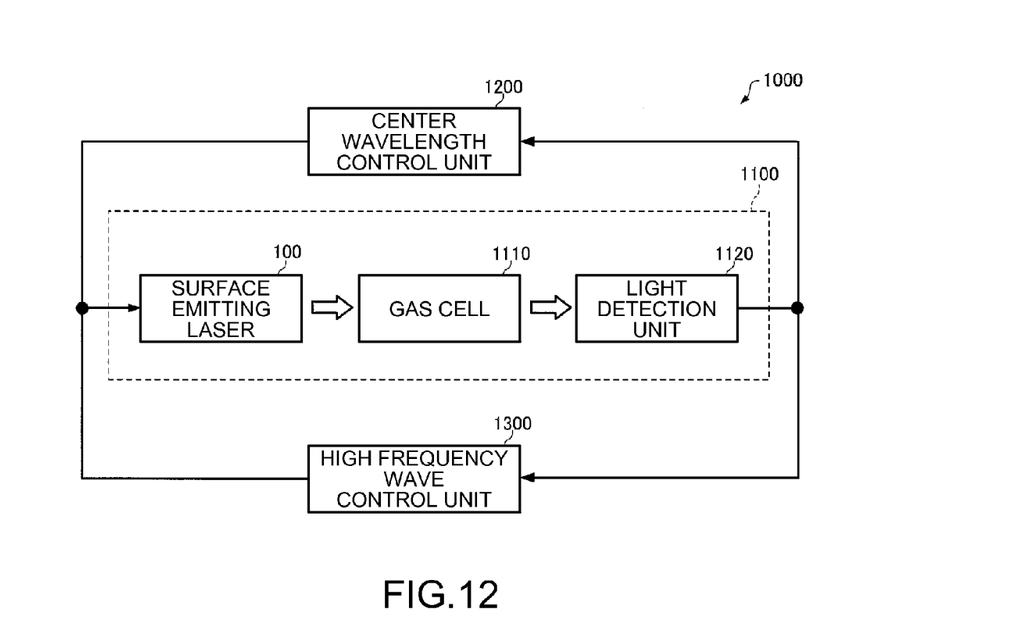
FIG. 12 is a functional block diagram illustrating an atomic oscillator according to this embodiment.

Next, an atomic oscillator according to this embodiment will be described with reference to the drawings. FIG. 12 is a functional block diagram illustrating an atomic oscillator 1000 according to this embodiment.

As illustrated in FIG. 12, the atomic oscillator 1000 includes an optical module 1100, a center wavelength control unit 1200, and a high frequency wave control unit 1300.

The optical module 1100 includes the surface emitting laser according to the invention (in the illustrated example, the surface emitting laser 100), a gas cell 1110, and a light detection unit 1120.

Figure 13:
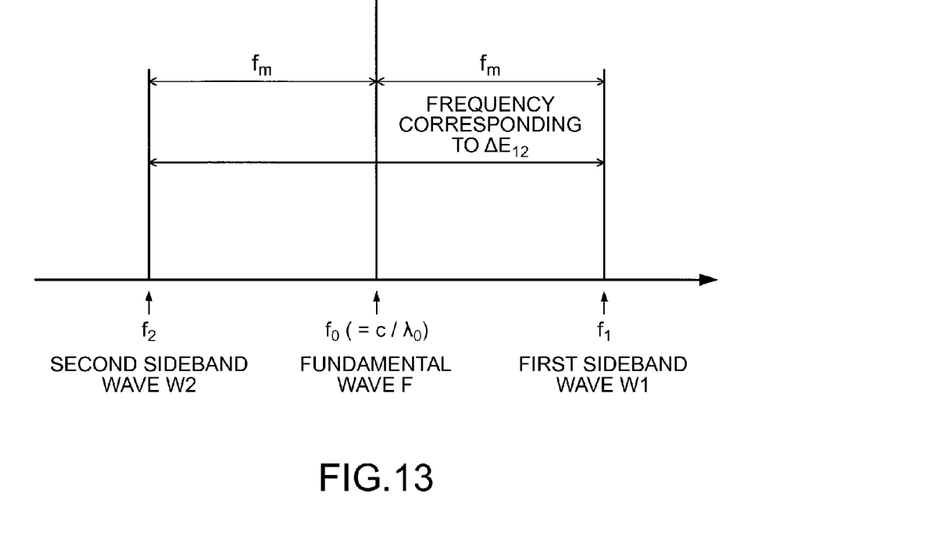
FIG. 13 is a diagram illustrating a frequency spectrum of resonant light.
Figure 14:
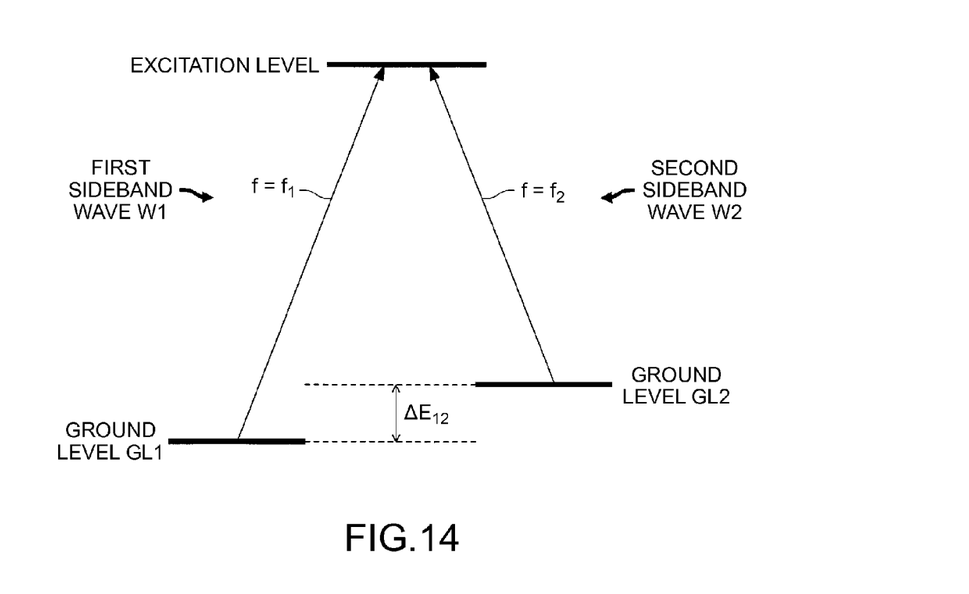
FIG. 14 is a diagram illustrating a relationship between a Λ type 3-level model of an alkali metal atom and a first sideband wave and a second sideband wave.

FIG. 13 is a diagram illustrating a frequency spectrum of light emitted from the surface emitting laser 100. FIG. 14 is a diagram illustrating a relationship between a Λ type 3-level model of an alkali metal atom and a first sideband wave W1 and a second sideband wave W2. The light emitted from the surface emitting laser 100 includes a fundamental wave F having a center frequency $f_0$ (=$c/\lambda_0$: c is the speed of the light, and $\lambda_0$ is the center wavelength of the laser light), a first sideband wave W1 having a frequency $f_1$ on an upper sideband with respect to the center frequency $f_0$, and a second sideband wave W2 having a frequency $f_2$ on a lower sideband with respect to the center frequency $f_0$, which are illustrated in FIG. 13. The frequency $f_1$ of the first sideband wave W1 is $f_1=f_0+f_m$, and the frequency $f_2$ of the second sideband wave W2 is $f_2=f_0-f_m$.

As illustrated in FIG. 14, a frequency difference between the frequency $f_1$ of the first sideband wave W1 and the frequency $f_2$ of the second sideband wave W2 is coincident with a frequency corresponding to an energy difference $\Delta E_{12}$ between a ground level GL1 and a ground level GL2 of the alkali metal atom. Therefore, the alkali metal atom causes an EIT phenomenon due to the first sideband wave W1 having the frequency $f_1$ and the second sideband wave W2 having the frequency $f_2$.

The gas cell 1110 is formed by sealing a container with a gaseous alkali metal atom (a sodium atom, a rubidium atom, a cesium atom, and the like). When the gas cell 1110 is irradiated with two light waves having a frequency (a wavelength) corresponding to the energy difference between the two ground levels of the alkali metal atom, the alkali metal atom causes the EIT phenomenon. For example, when the alkali metal atom is a cesium atom, the frequency corresponding to the energy difference between the ground level GL1 and the ground level GL2 on a D1 line is 9.19263 . . . GHz, and thus when the gas cell 1110 is irradiated with the two light waves in which the frequency difference is 9.19263 . . . GHz, the EIT phenomenon occurs.

The light detection unit 1120 detects the intensity of the light transmitted through the alkali metal atom sealed in the gas cell 1110. The light detection unit 1120 outputs a detection signal according to the intensity of the light transmitted through the alkali metal atom. As the light detection unit 1120, for example, a photodiode is used.

The center wavelength control unit 1200 generates a driving current having a magnitude according to the detection signal output from the light detection unit 1120 and supplies the driving current to the surface emitting laser 100, and controls the center wavelength $\lambda_0$ of the light emitted from the surface emitting laser 100. According to a feedback loop through the surface emitting laser 100, the gas cell 1110, the light detection unit 1120, and the center wavelength control unit 1200, the center wavelength $\lambda_0$ of the laser light emitted from the surface emitting laser 100 is finely adjusted and becomes stable.

The high frequency wave control unit 1300 controls the wavelength (frequency) difference between the first sideband wave W1 and the second sideband wave W2 such that the wavelength difference is identical to the frequency corresponding to the energy difference between the two ground levels of the alkali metal atom sealed in the gas cell 1110 on the basis of the detection result output from the light detection unit 1120. The high frequency wave control unit 1300 generates a modulation signal having a modulation frequency $f_m$ (refer to FIG. 13) according to the detection result output from the light detection unit 1120.

According to a feedback loop through the surface emitting laser 100, the gas cell 1110, the light detection unit 1120, and the high frequency wave control unit 1300, feedback control is performed such that the frequency difference between the first sideband wave W1 and the second sideband wave W2 is extremely accurately coincident with the frequency corresponding to the energy difference between the two ground levels of the alkali metal atom. As a result thereof, the modulation frequency $f_m$ becomes an extremely stable frequency, and thus the modulation signal is able to be an output signal (clock output) of the atomic oscillator 1000.

Next, the operation of the atomic oscillator 1000 will be described with reference to FIG. 12 to FIG. 14.

The laser light emitted from the surface emitting laser 100 is incident on the gas cell 1110. The light emitted from the surface emitting laser 100 includes the two light waves (the first sideband wave W1 and the second sideband wave W2) having the frequency (the wavelength) corresponding to the energy difference between the two ground levels of the alkali metal atom, and the alkali metal atom causes the EIT phenomenon. The intensity of the light transmitted through the gas cell 1110 is detected by the light detection unit 1120.

The center wavelength control unit 1200 and the high frequency wave control unit 1300 performs the feedback control such that the frequency difference between the first sideband wave W1 and the second sideband wave W2 is extremely accurately coincident with the frequency corresponding to the energy difference between the two ground levels of the alkali metal atom. In the atomic oscillator 1000, a rapid change in light absorption behavior at the time that the frequency difference $f_1-f_2$ between the first sideband wave W1 and the second sideband wave W2 is shifted from the frequency corresponding to the energy difference $\Delta E_{12}$ between the ground level GL1 and the ground level GL2 is detected and controlled by using the EIT phenomenon, and thus the oscillator having high accuracy is able to be manufactured.

The invention includes a configuration which is substantially identical to the configuration described in the embodiment (for example, a configuration having the same function, method, and result as those of the configuration described in the embodiment, or a configuration having the same object and effect as those of the configuration described in the embodiment). In addition, the invention includes a configuration in which parts which are not essential to the configuration described in the embodiment are substituted. In addition, the invention includes a configuration which is able to attain the same functional effect as that of the configuration described in the embodiment or a configuration which is able to attain the same object as that the configuration described in the embodiment. In addition, the invention includes a configuration in which a known technology is added to the configuration described in the embodiment.

The entire disclosure of Japanese Patent Application No. 2014-220035, filed Oct. 29, 2014 is expressly incorporated by reference herein.

What is claimed is:

1. A surface emitting laser comprising:
a substrate; and
a laminated body disposed over the substrate,
wherein the laminated body includes a first mirror layer disposed over the substrate, an active layer disposed over the first mirror layer, and a second mirror layer disposed over the active layer, and
a surface roughness Ra of an uppermost layer of the first mirror layer that abuts the active layer is greater than or equal to 0.45 nm and less than or equal to 1.0 nm.

2. The surface emitting laser according to claim 1, wherein the first mirror layer includes a first layer formed of AlGaAs, and a second layer formed of AlGaAs of which an Al composition is lower than that of the first layer.

3. The surface emitting laser according to claim 2, wherein a concentration of carbon doped onto the first layer is greater than or equal to $7.5 \times 10^{17}$ cm$^{-3}$ and less than or equal to $2.0 \times 10^{18}$ cm$^{-3}$.

4. An atomic oscillator comprising the surface emitting laser according to claim 1.

5. An atomic oscillator comprising the surface emitting laser according to claim 2.

6. An atomic oscillator comprising the surface emitting laser according to claim 3.

7. A manufacturing method of a surface emitting laser, comprising:
forming a first mirror layer over a substrate;
forming an active layer over the first mirror layer;
forming a second mirror layer over the active layer; and
forming a laminated body by patterning the first mirror layer, the active layer, and the second mirror layer,
wherein in the forming of the first mirror layer, a surface roughness Ra of an uppermost layer of the first mirror layer that is configured to abut the active layer is controlled to be greater than or equal to 0.45 nm and less than or equal to 1.0 nm by controlling a concentration of carbon doped onto the first mirror layer.

8. The manufacturing method of a surface emitting laser according to claim 7, wherein the first mirror layer includes a first layer formed of AlGaAs, and a second layer formed of AlGaAs of which an Al composition is lower than that of the first layer.

9. The manufacturing method of a surface emitting laser according to claim 8, wherein in the forming of the first mirror layer, the concentration of the carbon doped onto the first layer is greater than or equal to $7.5 \times 10^{17}$ cm$^{-3}$ and less than or equal to $2.0 \times 10^{18}$ cm$^{-3}$.

10. The surface emitting laser according to claim 1, wherein the uppermost layer of the first mirror layer directly abuts the active layer.

11. The manufacturing method of the surface emitting laser according to claim 7, wherein the uppermost layer of the first mirror layer is configured to directly abut the active layer.

* * * * *